United States Patent
Hagihara

(10) Patent No.: US 6,822,211 B2
(45) Date of Patent: Nov. 23, 2004

(54) SOLID-STATE IMAGE-SENSING DEVICE

(75) Inventor: Yoshio Hagihara, Yokohama (JP)

(73) Assignee: Minolta Co., Ltd., Osaka (JP)

( * ) Notice: Subject to any disclaimer, the term of this patent is extended or adjusted under 35 U.S.C. 154(b) by 21 days.

(21) Appl. No.: 09/896,573

(22) Filed: Jun. 29, 2001

(65) Prior Publication Data

US 2002/0000509 A1 Jan. 3, 2002

(30) Foreign Application Priority Data

Jun. 30, 2000 (JP) ........................................ 2000-197745

(51) Int. Cl.$^7$ ............................. H01L 27/00; H04N 3/14
(52) U.S. Cl. ............................... 250/208.1; 250/214 C; 348/294; 348/308
(58) Field of Search ................................ 348/294, 295, 348/300, 301, 308; 250/214 C, 214 L, 214 R, 208.1, 208.2, 214.1

(56) References Cited

U.S. PATENT DOCUMENTS

| | | | |
|---|---|---|---|
| 5,241,575 A | 8/1993 | Miyatake et al. | ............. 377/60 |
| 5,861,621 A | 1/1999 | Takebe et al. | ........ 250/214 R |
| 6,133,862 A | * 10/2000 | Dhuse et al. | ............... 341/118 |
| 6,191,408 B1 | * 2/2001 | Shinotsuka et al. | ...... 250/208.1 |
| 6,433,823 B1 | * 8/2002 | Nakamura et al. | .......... 348/254 |

FOREIGN PATENT DOCUMENTS

JP          07-087284 A          3/1995

* cited by examiner

Primary Examiner—Stephone B. Allen
(74) Attorney, Agent, or Firm—Sidley Austin Brown & Wood LLP

(57) ABSTRACT

In a solid-state image-sensing device, first, the outputs of compensation pixels G10 to Gm0, provided one for each column of pixels, are fed to a line memory 10 so as to be stored therein as compensation data with which to achieve column-by-column compensation. Then, as the outputs of ordinary pixels G11 to Gmn are fed as image data to the non-inverting input terminal of a differential amplifier circuit 11, the compensation data obtained from the compensation pixel arranged in the same column as the ordinary pixels of which the output signals are currently handled is fed to the inverting input terminal of the differential amplifier circuit 11. In this way, the image data from the individual ordinary pixels is fed out after being compensated, by the differential amplifier circuit 11, with the compensation data stored in the line memory 10.

23 Claims, 8 Drawing Sheets

SOLID-STATE IMAGE-SENSING DEVICE

This application is based on Japanese Patent Application No. 2000-197745 filed on Jun. 30, 2000, the contents of which are hereby incorporated by reference.

BACKGROUND OF THE INVENTION

1. Field of the Invention

The present invention relates to a solid-state image-sensing device, and particularly to a solid-state image-sensing device having pixels arranged in a two-dimensional array.

2. Description of the Prior Art

Conventionally, a solid-state image-sensing device having photosensitive elements such as photodiodes (hereinafter, such an image-sensing device will be referred to as an "area sensor") has constant-current sources, for amplifying the output signals from the individual pixels, provided one for each column of pixels. An example of such an area sensor is shown in FIG. 15.

In FIG. 15, reference symbols G11 to Gmn represent pixels arranged in rows and columns (in a matrix). Reference numeral 51 represents a vertical scanning circuit, which scans rows (lines) 53-1, 53-2, ..., 53-n sequentially. Reference numeral 52 represents a horizontal scanning circuit, which reads out photoelectric conversion signals, which are delivered from the pixels to output signal lines 55-1, 55-2, ..., 55-m, sequentially pixel by pixel in the horizontal direction. Reference numeral 54 represents a power line.

Moreover, as shown in the figure, for each of the output signal lines 55-1, 55-2, ..., 55-m, a pair of N-channel MOS transistors Q1 and Q2 is provided. Here, a description will be given only with respect to the output signal line 55-1 as a representative. The MOS transistor Q1 has its gate connected to a direct-current voltage line 56, has its drain connected to the output signal line 55-1, and has its source connected to a line 57 of a direct-current voltage VPSA. On the other hand, the MOS transistor Q2 has its drain connected to the output signal line 55-1, has its source connected to a signal line 58 serving as a final destination line, and has its gate connected to the horizontal scanning circuit 52.

In the pixels G11 to Gmn provided in the area sensor shown in FIG. 15, photoelectric charges occur, and the pixels G11 to Gmn feed output currents based on those photoelectric charges to the output signal lines 55-1 to 55-m. Since the MOS transistors Q1 have their drains connected to the output signal lines 55-1 to 55-m and receive a direct-current voltage DC at their gates all the time, they are equivalent to resistors or constant-current sources, and thus serve to voltage-amplify the output currents fed to the output signal lines.

The MOS transistors Q2 are controlled by the horizontal scanning circuit 52 so as to act as switching devices for selecting a column. With the MOS transistors Q1 configured in this way, it is possible to yield output signals at a high gain. As a result, even if the output signals from the individual pixels are low, the amplifier circuit including those MOS transistors Q1 amplifies them to a sufficiently high level, making them easier to process in the signal processing circuit (not shown) in the succeeding stage.

However, the circuit configuration described above has the following disadvantage. As shown in FIG. 15, the output signals from the individual pixels are amplified by the MOS transistors Q1 provided one for each column. If the characteristics of these MOS transistors Q1 vary among them, the output signals from the pixels belonging to different columns are amplified by different amplification factors. Accordingly, although there is no variation among the output signals from the pixels arranged in an identical column, there appear variations among the output signals from the pixels arranged in an identical row because those output signals are amplified by different amplification factors. As a result, when an image is reproduced from the output signals obtained from an area sensor like this, variations in the amplification factors among the MOS transistors Q1 that are provided, one for each column, cause fixed pattern noise that looks like vertical stripes.

SUMMARY OF THE INVENTION

An object of the present invention is to provide a solid-state image-sensing device capable of canceling fixed pattern noise resulting from variations in the output signals of the solid-state image-sensing device due to the circuit configuration thereof or the like.

To achieve the above object, according to one aspect of the present invention, a solid-state image-sensing device is provided with: a first pixel including a photoelectric conversion element and capable of generating an output signal that is logarithmically proportional to the amount of light incident on the photoelectric conversion element; a second pixel for generating as an output signal a compensation signal with which to compensate the output signal of the first pixel; and a reading circuit for reading out the output signals of the first and second pixels.

According to another aspect of the present invention, a solid-state image-sensing device is provided with: a first pixel including a photoelectric conversion element and capable of generating selectively either an output signal that is logarithmically proportional to the amount of light incident on the photoelectric conversion element or an output signal that is linearly proportional to the amount of light incident on the photoelectric conversion element; a second pixel for generating as an output signal a compensation signal with which to compensate the output signal of the first pixel; and a reading circuit for reading out the output signals of the first and second pixels.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

An Example of the Configuration of a Solid-State Image-Sensing Device (Area Sensor)

Figure 1:
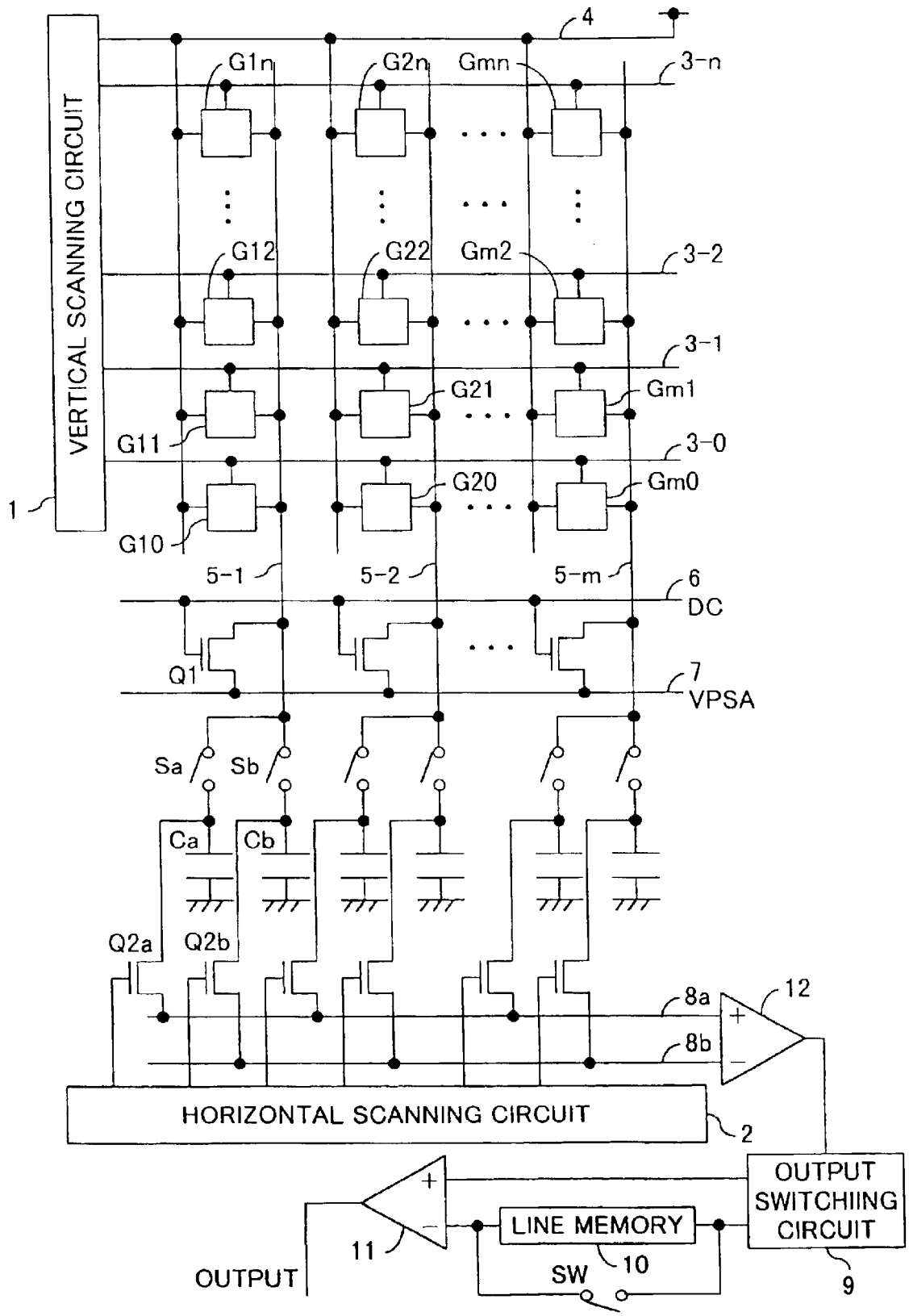
FIG. 1 is a block diagram showing the internal configuration of an area sensor embodying the invention.

FIG. 1 schematically shows the configuration of a portion of a two-dimensional MOS-type solid-state image-sensing device (hereinafter referred to as the "area sensor") embodying the invention. In this figure, reference symbols G11 to Gmn represent pixels, arranged in rows and columns (in a matrix), for image sensing (hereinafter, these pixels are referred to as the "ordinary pixels"). On the other hand, reference symbols G10 to Gm0 represent pixels that each output compensation data with which to compensate the output signals of the ordinary pixels arranged in the same column (hereinafter, these pixels are referred to as the "compensation pixels"). Reference numeral 1 represents a vertical scanning circuit, which scans rows (lines) 3-0, 3-1, 3-2, . . . , 3-n sequentially. Reference numeral 2 represents a horizontal scanning circuit, which reads out photoelectric conversion signals, which are delivered from the pixels to output signal lines 5-1, 5-2, . . . , 5-m, sequentially pixel by pixel in the horizontal direction. Reference numeral 4 represents a power line. In reality, the individual pixels are connected not only to the lines 3-0, 3-1, 3-2, . . . , 3-n, the output signal lines 5-1, 5-2, . . . , 5-m, and the power line 4 mentioned above, but also to other lines (for example, clock lines and bias supply lines); however, these other lines are omitted in FIG. 1, and will be shown in the diagrams of the individual embodiments shown in FIG. 3 and the subsequent figures.

As shown in the figure, for each of the output signal lines 5-1, 5-2, . . . , 5-m, there is provided a set of N-channel MOS transistors Q1, Q2a, and Q2b, switches Sa and Sb, and capacitors Ca and Cb. Here, a description will be given only with respect to the output signal line 5-1 as a representative. The MOS transistor Q1 has its gate connected to a direct-current voltage line 6, has its drain connected to the output signal line 5-1, and has its source connected to a line 7 of a direct-current voltage VPSA. The MOS transistor Q2a has its drain connected by way of the switch Sa to the output signal line 5-1, has its source connected to a signal line 8a serving as a final destination line, and has its gate connected to the horizontal scanning circuit 2. The MOS transistor Q2b has its drain connected by way of the switch Sb to the output signal line 5-1, has its source connected to a signal line 8b serving as a final destination line, and has its gate connected to the horizontal scanning circuit 2. The capacitor Ca has one end grounded, and has the other end connected to the node between one end of the switch Sa and the drain of the MOS transistor Q2a. The capacitor Cb has one end grounded, and has the other end connected to the node between one end of the switch Sb and the drain of the MOS transistor Q2b.

As will be described later, the ordinary pixels and the compensation pixels are each provided with an N-channel MOS transistor T2 that outputs a signal based on the photoelectric charge that has occurred therein. This MOS transistor T2 and the MOS transistor Q1 described above are interconnected as shown in FIG. 2A. Here, the direct-current voltage VPSA connected to the source of the MOS transistor Q1 and a direct-current voltage VPDA connected to the drain of the MOS transistor T2 fulfill the relation VPDA>VPSA, where VPSA equals, for example, the ground voltage. In this circuit configuration, the upper-stage MOS transistor T2 receives a signal at its gate, and the lower-stage MOS transistor Q1 receives a direct-current voltage DC at its gate all the time. Hence, the lower-stage MOS transistor Q1 is equivalent to a resistor or constant-current source, and thus the circuit shown in FIG. 2A acts as an amplifier circuit of a source follower type. In this case, it can safely be said that the amplification performed by the MOS transistor T2 yields a current as its output.

The MOS transistor Q2 (this MOS transistor Q2 refers to the MOS transistors Q2a and Q2b shown in FIG. 1 collectively) is controlled by the horizontal scanning circuit 2 so as to act as a switching device. As will be described later, in all the embodiments shown in FIG. 3 and the subsequent figures, each pixel is further provided with an N-channel MOS transistor T3 that acts as a switch. If this MOS transistor T3 is illustrated explicitly, the circuit shown in FIG. 2A has a configuration as shown in FIG. 2B. Specifically, the MOS transistor T3 is inserted between the MOS transistor Q1 and the MOS transistor T2. Here, the MOS transistor T3 serves to select a row, and the MOS transistor Q2 serves to select a column.

Figure 2A:
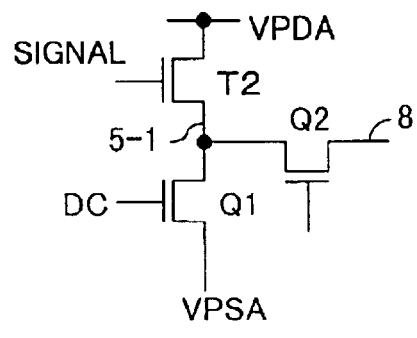
FIGS. 2A and 2B are circuit diagrams showing a portion of the area sensor shown in FIG. 1.
Figure 2B:
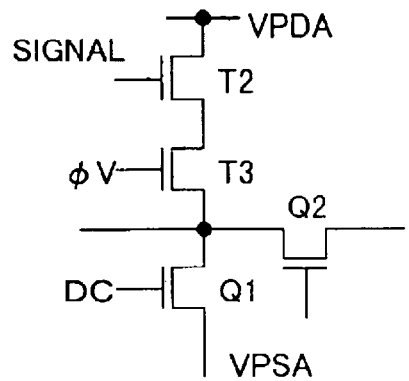

With the circuit configuration shown in FIGS. 2A and 2B, it is possible to output signals at a high gain. As a result, even in cases where photoelectric currents occurring in photosensitive elements are converted natural-logarithmically to obtain a wide dynamic range, and thus output signals are low if they are output as they are, the amplifier circuit described above amplifies the signals to a sufficiently high level, and thereby makes them easier to process in the signal processing circuit (not shown) in the succeeding stage. Alternatively, the MOS transistor Q1, which constitutes a load resistor in the amplifier circuit, may be provided not within each pixel, but one for each of the output signal lines 5-1, 5-2, . . . , 5-m, to each of which a plurality of pixels arranged in the corresponding column are connected collectively. This helps reduce the number of load resistors or constant-current sources, and thereby reduce the area occupied by the amplifier circuit on a semiconductor chip.

The signal line 8a is connected to the non-inverting input terminal of a differential amplifier circuit 12, and the signal line 8b is connected to the inverting input terminal of the differential amplifier circuit 12. The output of this differential amplifier circuit 12 is fed to an output switching circuit 9, which feeds the output signals of the compensation pixels G10 to Gm0 to a line memory 10 and the output signals of the ordinary pixels G11 to Gmn to the non-inverting input terminal of a differential amplifier circuit 11. The output signals of the compensation pixels G10 to Gm0 stored in the line memory 10 are fed to the inverting input terminal of the differential amplifier circuit 11. A switch SW is connected between the input and output sides of the line memory 10.

Now, the operation of the area sensor configured as described above will be described. Suppose that, now, image sensing is going to be performed to obtain an image that constitutes a frame. First, the vertical scanning circuit 1 feeds, by way of the line 3-0, a signal φV to the gates of the MOS transistors T3 (described later) provided in the compensation pixels G10 to Gm0. At this time, the output switching circuit 9 connects together the output side of the differential amplifier circuit 12 and the input side of the line memory 10 and in addition the switch SW is turned off so that the output signals fed from the differential amplifier circuit 12 will be fed to the line memory 10.

Then, the switches Sa connected individually to the output signal lines 5-1, 5-2, . . . , 5-m are turned on simultaneously so that the compensation data output from the individual compensation pixels G10 to Gm0 as a result of the MOS transistors T3 provided therein being turned on is stored in the capacitors Ca. Next, the switches Sa are turned off, and then the switches Sb are turned on so that the noise components obtained from the individual compensation pixels G10 to Gm0 as a result of the MOS transistors T3 provided therein being turned off, or as a result of the compensation pixels G10 to Gm0 being reset, are stored in the capacitors Cb.

Then, the horizontal scanning circuit 2 turns on the MOS transistors Q2a and Q2b for one of the output signal lines 5-1 to 5-m after another so that the compensation data from the compensation pixels G10, G20, . . . , Gm0 is sequentially fed by way of the signal line 8a to the non-inverting input terminal of the differential amplifier circuit 12 and the noise components from the compensation pixels G10, G20, . . . , Gm0 are sequentially fed by way of the signal line 8b to the inverting input terminal of the differential amplifier circuit 12. Thus, the differential amplifier circuit 12 eliminates from the compensation data obtained from the individual compensation pixels G10 to Gm0 the noise components obtained from the respective pixels. The compensation data thus cleared of noise components is then fed by way of the output switching circuit 9 to the line memory 10. In this way, the compensation data from the compensation pixels G10 to Gm0 is stored in the line memory 10 in the order G10, G20, . . . , Gm0.

Next, the output switching circuit 9 connects the differential amplifier circuit 12 to the non-inverting input terminal of the differential amplifier circuit 11 so that the output signals fed from the differential amplifier circuit 12 will be fed to the differential amplifier circuit 11. In addition, the switch SW is turned on so that the compensation data output from the line memory 10 is fed back to the line memory 10. Then, the vertical scanning circuit 1 feeds, first by way of the line 3-1, the signal φV to the gates of the MOS transistors T3 (described later) provided in the ordinary pixels G11 to Gm1.

Then, the switches Sa connected individually to the output signal lines 5-1, 5-2, . . . , 5-m are turned on simultaneously so that the image data output from the individual ordinary pixels G11, G21, . . . , Gm1 as a result of the MOS transistors T3 provided therein being turned on is stored in the capacitors Ca. Next, the switches Sa are turned off, and then the switches Sb are turned on so that the noise components obtained from the individual ordinary pixels G11 to Gm1 as a result of the MOS transistors T3 provided therein being turned off, or as a result of the ordinary pixels G11 to Gm1 being reset, are stored in the capacitors Cb.

Then, the horizontal scanning circuit 2 turns on the MOS transistors Q2a and Q2b for one of the output signal lines 5-1 to 5-m after another so that the image data from the ordinary pixels G11, G21, . . . , Gm1 is sequentially fed by way of the signal line 8a to the non-inverting input terminal of the differential amplifier circuit 12 and the noise components from the ordinary pixels G11, G21, . . . , Gm1 are sequentially fed by way of the signal line 8b to the inverting input terminal of the differential amplifier circuit 12. Thus, the differential amplifier circuit 12 eliminates from the image data obtained from the individual ordinary pixels G11 to Gm1 the noise components obtained from the respective pixels. The image data thus cleared of noise components is then fed by way of the output switching circuit 9 to the non-inverting input terminal of the differential amplifier circuit 11. Simultaneously, the compensation data from the compensation pixels G10 to Gm0 stored in the line memory 10 is fed from the output side of the line memory 10 to the inverting input terminal of the differential amplifier circuit 11 and to the input side of the line memory 10 in the order G10, G20, . . . , Gm0.

In this way, the differential amplifier circuit 11 is fed with the compensation data and the image data. When the differential amplifier circuit 11 receives the image data from the ordinary pixel G11 at its non-inverting input terminal and the compensation data from the compensation pixel G10 at its inverting input terminal, it calculates the difference between the image data and the compensation data, and thereby outputs compensated image data with respect to the ordinary pixel G11. At this time, the compensation data from the compensation pixel G10 is fed by way of the switch SW to the input side of the line memory 10, with the result that, now, the compensation data is stored in the line memory 10 in the order G20, G30, . . . , Gm0, G10.

In this way, the differential amplifier circuit 11 outputs compensated image data with respect to the ordinary pixel G11. Next, when the differential amplifier circuit 11 receives the image data from the ordinary pixel G21 at its non-inverting input terminal and the compensation data from the compensation pixel G20 at its inverting input terminal, it calculates the difference between the image data and the compensation data, and thereby outputs compensated image data with respect to the ordinary pixel G21. At this time, in the same manner as described above, the compensation data from the compensation pixel G20 is fed by way of the switch SW to the input side of the line memory 10, with the result that, now, the compensation data is stored in the line memory 10 in the order G30, G40, . . . , Gm0, G10, G20.

Then, with respect to the image data obtained from the ordinary pixels G31 to Gm1 and the compensation data obtained from the compensation pixels G30 to Gm0, the same operations as described above are performed repeatedly. As a result, the differential amplifier circuit 11 sequentially outputs compensated image data with respect to the ordinary pixels G31 to Gm1. When the differential amplifier circuit 11 finishes outputting compensated image data with respect to the ordinary pixel Gm1, the compensation data is stored in the line memory 10 in the order G10, G20, . . . , Gm0.

When the differential amplifier circuit 11 completes outputting compensated image data with respect to the ordinary pixels G31 to Gm1 in this way, the vertical scanning circuit 1 feeds, this time by way of the line 3-2, the signal φV to the gates of the MOS transistors T3 (described later) provided in the ordinary pixels G12 to Gm2. Then, the switches Sa connected individually to the output signal lines 5-1, 5-2, . . . , 5-m are turned on simultaneously so that the image data from the ordinary pixels G12 to Gm2 is stored in the capacitors Ca. Next, the switches Sa are turned off, and then the switches Sb are turned on so that the noise components from those ordinary pixels G12 to Gm2 are stored in the capacitors Cb.

Then, the horizontal scanning circuit 2 turns on the MOS transistors Q2a and Q2b connected to the output signal lines 5-1 to 5-m for one output signal line after another so that the image data and the noise components from the ordinary pixels G12, G22, ..., Gm2 are sequentially fed by way of the signal lines 8a and 8b to the non-inverting input terminal and the inverting input terminal of the differential amplifier circuit 12. Thus, the differential amplifier circuit 12 eliminates from the image data obtained from the individual ordinary pixels G12 to Gm2 the noise components obtained from the respective pixels. The image data thus cleared of noise components is then fed by way of the output switching circuit 9 to the non-inverting input terminal of the differential amplifier circuit 11. Simultaneously, just as when the image data from the ordinary pixels G11 to Gm1 is output, the compensation data from the compensation pixels G10 to Gm0 stored in the line memory 10 is fed from the output side of the line memory 10 to the inverting input terminal of the differential amplifier circuit 11 and to the input side of the line memory 10 in the order G10, G20, ..., Gm0.

In this way, the differential amplifier circuit 11 sequentially outputs the image data obtained from the ordinary pixels G12, G22, ..., Gm2 after compensating it with the compensation data obtained from the compensation pixels G10, G20, ..., Gm0. Simultaneously, the compensation data obtained from the compensation pixels G10, G20, ..., Gm0 and output from the output side of the line memory 10 is fed by way of the switch SW back to the input side of the line memory 10. Thus, when the differential amplifier circuit 11 finishes outputting compensated image data with respect to the ordinary pixel Gm2, the compensation data is stored in the line memory 10 in the order G10, G20, ..., Gm0.

The operations described above are performed every time the vertical scanning circuit 1 feeds, by way of the lines 3-3, 3-4, ..., 3-n, the signal $\phi V$ to the ordinary pixels G13 to Gm3, G14 to Gm4, ..., G1n to Gmn. As a result, the differential amplifier circuit 11 sequentially outputs compensated image data with respect to the ordinary pixels G13 to Gmn.

The circuit configurations and operations described above are common to all of the first to fourth embodiments described hereinafter.

First Embodiment

Figure 3:
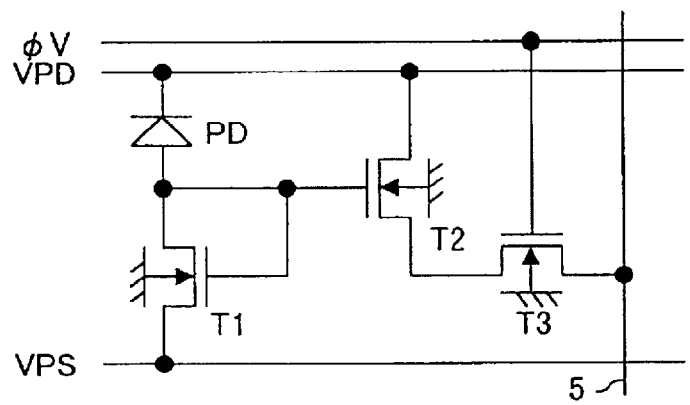
FIG. 3 is a circuit diagram showing an example of the configuration of an ordinary pixel.
Figure 4:
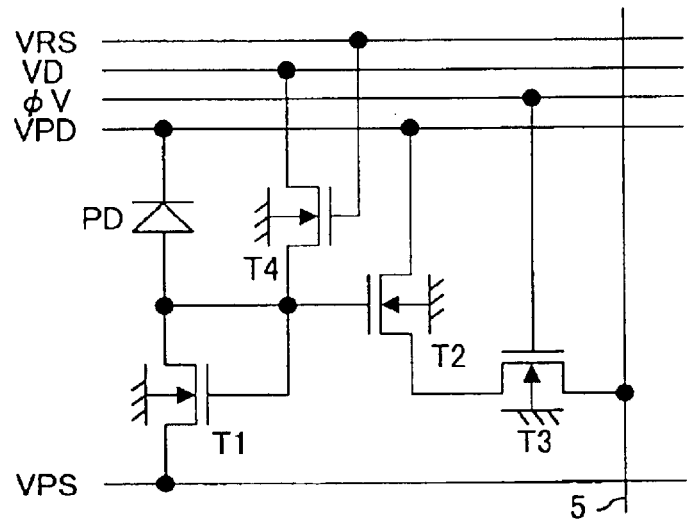
FIG. 4 is a circuit diagram showing an example of the configuration of a compensation pixel.
Figure 5:
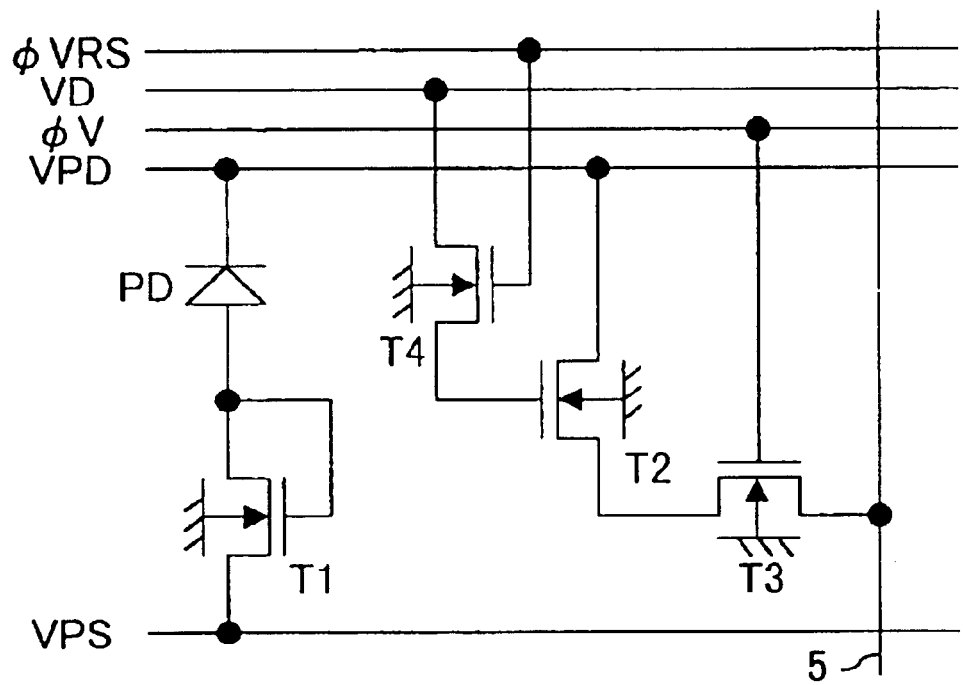
FIG. 5 is a circuit diagram showing another example of the configuration of a compensation pixel.
Figure 6:
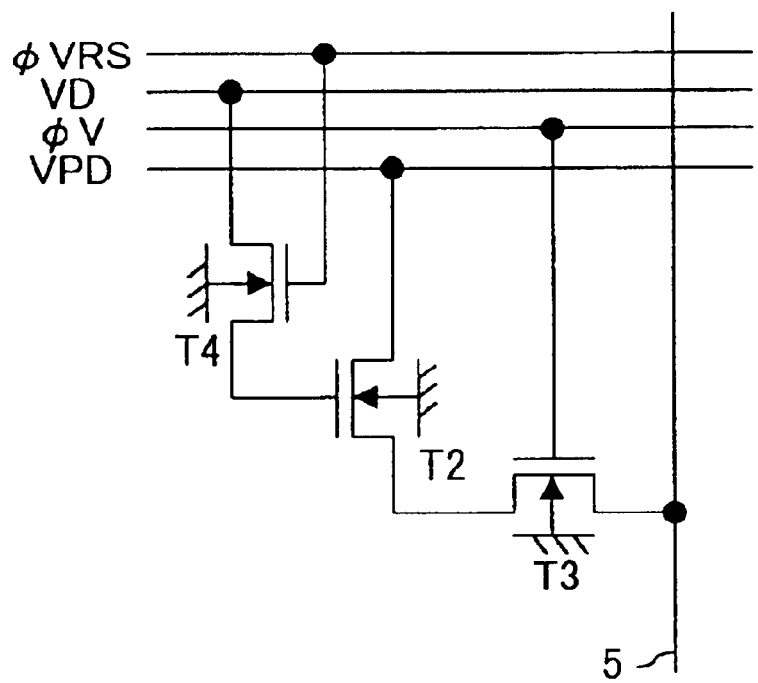
FIG. 6 is a circuit diagram showing another example of the configuration of a compensation pixel.

A first embodiment of the invention, which is applicable to the ordinary pixels provided in an area sensor configured as shown in FIG. 1, will be described below with reference to the drawings. FIG. 3 is a circuit diagram showing an example of the configuration of the ordinary pixels in this embodiment. FIGS. 4 to 6 are circuit diagrams showing examples of the configuration of the compensation pixels in this embodiment.

1. Configuration of the Ordinary Pixels

The pixel shown in FIG. 3 is configured as follows. A direct-current voltage VPD is applied to the cathode of a photodiode PD, of which the anode is connected to the drain and gate of a MOS transistor T1 and to the gate of a MOS transistor T2. The source of this MOS transistor T2 is connected to the drain of a MOS transistor T3. The source of the MOS transistor T3 is connected to a signal line 5 (which corresponds to the signal lines 5-1 to 5-m shown in FIG. 1). The MOS transistors T1 to T3 are all N-channel MOS transistors with their back gates grounded. The direct-current voltage VPD is also fed to the drain of the MOS transistor T2, and a direct-current voltage VPS is fed to the source of the MOS transistor T1. The signal $\phi V$ is fed to the gate of the MOS transistor T3. The MOS transistor T1 and the photodiode PD together constitute a photoelectric conversion circuit, and the MOS transistors T2 and T3 together constitute an output amplifier circuit.

In this pixel configured as described above, when light is incident on the photodiode PD, a photocurrent occurs therein and, owing to the subthreshold characteristics of a MOS transistor, a voltage natural-logarithmically proportional to the photocurrent appears at the gates of the MOS transistors T1 and T2. In this state, when a pulse is fed, as the signal $\phi V$, to the MOS transistor T3, the MOS transistor T2 outputs, as an output current, its source current, which is commensurate with its gate voltage, through the MOS transistor T3 to the signal line 5.

Here, the MOS transistor T2 acts as a MOS transistor of a source follower type, and thus image data appears as a voltage signal on the signal line 5. Moreover, the output signal output through the MOS transistor T3 is proportional to the gate voltage of the MOS transistor T2, and is thus a signal natural-logarithmically proportional to the amount of light incident on the photodiode PD. As described previously, this image data is, when the switch Sa is turned on, fed by way of the signal line 5 and the switch Sa to the capacitor Ca.

After the image data is stored in the capacitor Ca in this way, the MOS transistor T3 and the switch Sa are turned off and the switch Sb is turned on so that the noise component occurring in each pixel is fed by way of the signal line 5 and the switch Sb to the capacitor Cb.

2. First Example of the Configuration of the Compensation Pixels.

An example of the configuration of the compensation pixels used in cases where the ordinary pixels are configured as shown in FIG. 3 will be described below. In the configuration shown in FIG. 4, such circuit components as serve the same purposes as in the pixel shown in FIG. 3 are identified with the same reference numerals, and their explanations will be omitted.

The pixel shown in FIG. 4 is obtained by additionally providing, in the pixel shown in FIG. 3, a MOS transistor T4 having its drain connected to the drain and gate of the MOS transistor T1 and to the gate of the MOS transistor T2. This MOS transistor T4 receives a direct-current voltage VD at its source, and receives a signal $\phi VRS$ at its gate. The MOS transistor T4 is, like the MOS transistors T1 to T3, an N-channel MOS transistor with its back gate grounded.

In this pixel configured as described above, first, the signal $\phi VRS$ is turned to a high level to turn on the MOS transistor T4, so that the direct-current voltage VD is fed to the anode of the photodiode PD, to the gate and drain of the MOS transistor T1, and to the gate of the MOS transistor T2. In this state, when a pulse is fed, as the signal $\phi V$, to the MOS transistor T3, the MOS transistor T2 outputs, as an output current, its source current, which is commensurate with the direct-current voltage VD fed to its gate, through the MOS transistor T3 to the signal line 5.

Here, the MOS transistor T2 acts as a MOS transistor of a source follower type, and thus compensation data appears as a voltage signal on the signal line 5. Moreover, the output signal output through the MOS transistor T3 is proportional to the gate voltage of the MOS transistor T2, and is thus a signal that is commensurate with the direct-current voltage VD. As described previously, this compensation data is, when the switch Sa is turned on, fed by way of the signal line 5 and the switch Sa to the capacitor Ca.

After the compensation data is stored in the capacitor Ca in this way, the MOS transistor T3 and the switch Sa are turned off and the switch Sb is turned on so that the noise component occurring in each pixel is fed by way of the signal line 5 and the switch Sb to the capacitor Cb. At this time, the signal φVRS is at a low level.

The compensation data thus output is used as signals representing variations in characteristics among the MOS transistors Q1 (FIG. 1) connected to the signal lines 5-1 to 5-m (FIG. 1). By configuring the compensation pixels in largely the same manner as the ordinary pixels in this way, it is possible to obtain compensation data that reflects the potential state of the photoelectric conversion circuits; that is, it is possible to obtain compensation data under largely the same conditions under which the ordinary pixels operate.

3. Second Example of the Configuration of the Compensation Pixels.

Another example of the configuration of the compensation pixels used in cases where the ordinary pixels are configured as shown in FIG. 3 will be described below. In the configuration shown in FIG. 5, such circuit components as serve the same purposes as in the pixel shown in FIG. 4 are identified with the same reference numerals, and their explanations will be omitted.

The pixel shown in FIG. 5 differs from the pixel shown in FIG. 4 in that the node between the drain and gate of the MOS transistor T1 is not connected to the node between the gate of the MOS transistor T2 and the drain of the MOS transistor T4. Thus, the voltage that appears at the node between the gate and drain of the MOS transistor T1, which constitutes the photoelectric conversion circuit, is not fed to the gate of the MOS transistor T2, which constitutes the output amplifier circuit.

In this pixel configured as described above, as in the pixel shown in FIG. 4, first, the signal φVRS is turned to a high level to turn on the MOS transistor T4, so that the direct-current voltage VD is fed to the gate of the MOS transistor T2. In this state, when a pulse is fed, as the signal φV, to the MOS transistor T3, the MOS transistor T2 outputs, as an output current, its source current, which is commensurate with the direct-current voltage VD fed to its gate, through the MOS transistor T3 to the signal line 5.

Here, the MOS transistor T2 acts as a MOS transistor of a source follower type, and thus compensation data appears as a voltage signal on the signal line 5. Moreover, the output signal output through the MOS transistor T3 is proportional to the gate voltage of the MOS transistor T2, and is thus a signal that is commensurate with the direct-current voltage VD. As described previously, this compensation data is, when the switch Sa is turned on, fed by way of the signal line 5 and the switch Sa to the capacitor Ca.

After the compensation data is stored in the capacitor Ca in this way, the MOS transistor T3 and the switch Sa are turned off and the switch Sb is turned on so that the noise component occurring in each pixel is fed by way of the signal line 5 and the switch Sb to the capacitor Cb. At this time, the signal φVRS is at a low level.

The compensation data thus output is used as signals representing variations in characteristics among the MOS transistors Q1 (FIG. 1) connected to the signal lines 5-1 to 5-m (FIG. 1). By configuring the compensation pixels so as to include photoelectric conversion circuits in this way, it is possible to obtain compensation data that reflects the potential state of the photoelectric conversion circuits; that is, it is possible to obtain compensation data under largely the same conditions under which the ordinary pixels operate. Moreover, by disconnecting the photoelectric conversion circuits from the output amplifier circuits, it is possible to prevent the compensation data output from the output amplifier circuits from being influenced by the signals output from the photoelectric conversion circuits; that is, it is possible to obtain compensation data with the output amplifier circuits fed with a constant direct-current voltage all the time.

4. Third Example of the Configuration of the Compensation Pixels.

Another example of the configuration of the compensation pixels used in cases where the ordinary pixels are configured as shown in FIG. 3 will be described below. In the configuration shown FIG. 6, such circuit components as serve the same purposes as in the pixel shown in FIG. 5 are identified with the same reference numerals, and their explanations will be omitted.

The pixel shown in FIG. 6 is obtained by eliminating, from the pixel shown in FIG. 5, the MOS transistor T1 and the photodiode PD constituting the photoelectric conversion circuit. Thus, the pixel shown in FIG. 6 is composed of the output amplifier circuit constituted by the MOS transistors T2 and T3, plus the MOS transistor T4. In this pixel configured as described above, as in the pixel shown in FIG. 5, first, the signal φVRS is turned to a high level to turn on the MOS transistor T4, so that the direct-current voltage VD is fed to the gate of the MOS transistor T2. In this state, when a pulse is fed, as the signal φV, to the MOS transistor T3, the MOS transistor T2 outputs, as an output current, its source current, which is commensurate with the direct-current voltage VD fed to its gate, through the MOS transistor T3 to the signal line 5.

Here, the MOS transistor T2 acts as a MOS transistor of a source follower type, and thus compensation data appears as a voltage signal on the signal line 5. Moreover, the output signal output through the MOS transistor T3 is proportional to the gate voltage of the MOS transistor T2, and is thus a signal that is commensurate with the direct-current voltage VD. As described previously, this compensation data is, when the switch Sa is turned on, fed by way of the signal line 5 and the switch Sa to the capacitor Ca.

After the compensation data is stored in the capacitor Ca in this way, the MOS transistor T3 and the switch Sa are turned off and the switch Sb is turned on so that the noise component occurring in each pixel is fed by way of the signal line 5 and the switch Sb to the capacitor Cb. At this time, the signal φVRS is at a low level.

The compensation data thus output is used as signals representing variations in characteristics among the MOS transistors Q1 (FIG. 1) connected to the signal lines 5-1 to 5-m (FIG. 1). Configured in this way, the compensation pixel of this example has a simpler configuration than that of the second example (FIG. 5) of this embodiment, thanks to the elimination of the photoelectric conversion circuit. This helps make the compensation pixels smaller in size than the ordinary pixels, and thereby minimize the extent to which the size of the compensation pixels limits the size of the ordinary pixels.

The image data obtained from the ordinary pixel configured as shown in FIG. 3 is cleared of its noise component by the differential amplifier circuit 12 (FIG. 1), and is then output as image data that still includes the influence of the MOS transistor Q1. On the other hand, the compensation data output from the compensation pixel configured like one of the first to third examples described above of this embodiment is cleared of its noise component by the differential amplifier circuit 12, and is then subtracted from the image data by the differential amplifier circuit 11 (FIG. 1). In this way, the image data is cleared of the variation component resulting from the influence of the MOS transistor Q1. This makes it possible to eliminate fixed pattern noise such as vertical stripes.

Second Embodiment

Figure 7:
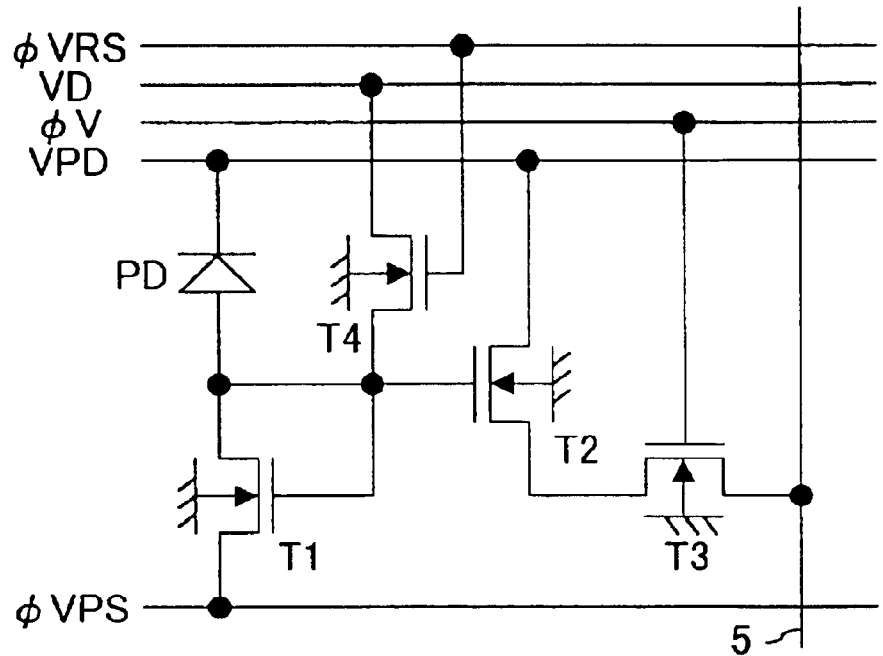
FIG. 7 is a circuit diagram showing another example of the configuration of an ordinary pixel.
Figure 8:
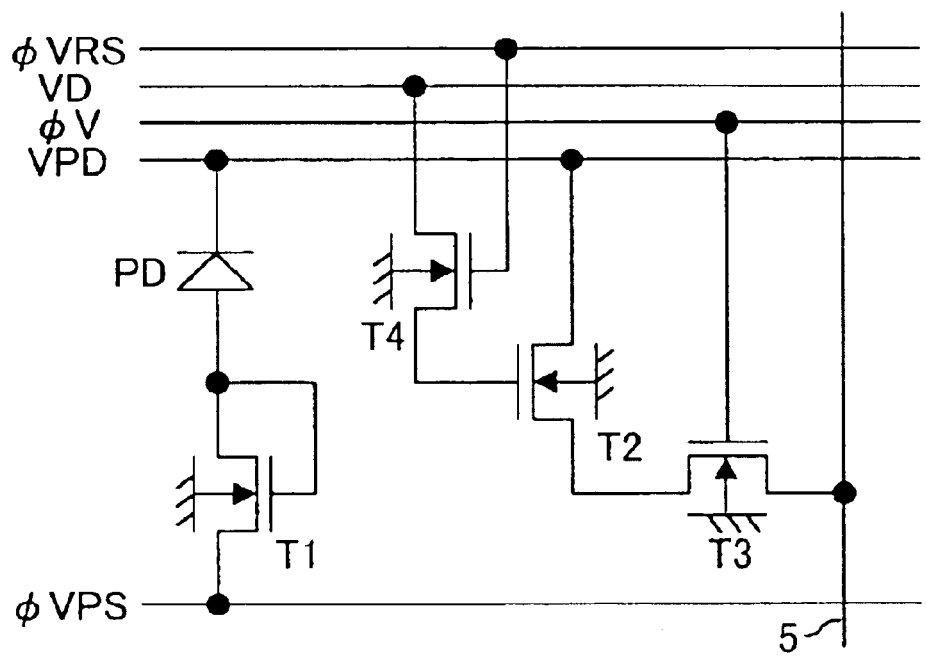
FIG. 8 is a circuit diagram showing another example of the configuration of a compensation pixel.

A second embodiment of the invention, which is applicable to the ordinary pixels provided in an area sensor configured as shown in FIG. 1, will be described below with reference to the drawings. FIG. 7 is a circuit diagram showing an example of the configuration of the ordinary pixels in this embodiment. As will be describe later, the circuit shown in FIG. 7 can also be used as a configuration of the compensation pixels. FIG. 8 is a circuit diagram showing an example of the configuration of the compensation pixels in this embodiment.

In the pixel shown FIG. 7, such circuit elements, signal lines, and the like as serve the same purposes as in the pixel shown in FIG. 4 are identified with the same reference numerals, and their explanations will be omitted. The pixel shown in FIG. 7 has the same circuit configuration as the pixel shown in FIG. 4 except that the MOS transistor T1 receives a signal φVPS at its source. This signal φVPS is a binary signal that takes one of two levels at a time, namely either a low level that permits the MOS transistors T1 and T2 to operate in a subthreshold region or a high level that approximately equals the direct-current voltage VPD. As in the first embodiment, the MOS transistor T1 and the photodiode PD together constitute a photoelectric conversion circuit, and the MOS transistors T2 and T3 together constitute an output amplifier circuit.

With this ordinary pixel configured as described above, by varying the voltage of the signal φVPS, it is possible to make it output image data obtained by either natural-logarithmically or linearly converting the photocurrent that has occurred in the photodiode PD. How this pixel operates when it outputs image data by natural-logarithmically or linearly converting the photocurrent will be described below, separately for each case.

(a) When the Pixel Outputs Image Data by Natural-Logarithmically Converting the Photocurrent First, the signal φVPS is turned to a low level so that the MOS transistors T1 and T2 are so biased as to operate in a subthreshold region. On the other hand, the MOS transistor T4 is kept fed with a low level as the signal φVRS at its gate so as to remain off; that is, the MOS transistor T4 can be regarded as practically nonexistent.

Thus, in practical terms, only the photodiode PD and the MOS transistors T1 to T3 operate just as in the first embodiment. Accordingly, as in the first embodiment, when light is incident on the photodiode PD, a photocurrent occurs therein, and a voltage natural-logarithmically proportional to the photocurrent appears at the gates of the MOS transistors T1 and T2. In this state, when a pulse is fed as the signal φV to the MOS transistor T3, the MOS transistor T2 outputs an output current.

Here, the MOS transistor T2 acts as a MOS transistor of a source follower type, and thus image data appears on the signal line 5 as a voltage signal that is natural-logarithmically proportional to the amount of light incident on the photodiode PD. As described previously, this image data is, when the switch Sa is turned on, fed by way of the signal line 5 and the switch Sa to the capacitor Ca.

After the image data is stored in the capacitor Ca in this way, the MOS transistor T3 and the switch Sa are turned off and the switch Sb is turned on so that the noise component occurring in each pixel is fed by way of the signal line 5 and the switch Sb to the capacitor Cb.

(b) When the Pixel Outputs Image Data by Linearly Converting the Photocurrent

First, the signal φVPS is turned to a high level so that the MOS transistor T1 is brought into a cut-off state. Then, a low level is fed as the signal φVRS to the gate of the MOS transistor T4 to turn it off. In this state, when light is incident on the photodiode PD, a photocurrent occurs therein. At this time, the junction capacitance existing between the back gate and gate of the MOS transistor T1 and in the photodiode PD causes the electric charge resulting from the photocurrent to accumulate at the gate and drain of the MOS transistor T1. Thus, the gate voltage of the MOS transistors T1 and T2 is proportional to the integral of the photocurrent.

Then, a pulse is fed as the signal φV to the gate of the MOS transistor T3 to turn it on. As a result, the MOS transistor T2 outputs, as an output current, its source current, which is proportional to the voltage appearing at its gate, through the MOS transistor T3 to the signal line 5. Here, the MOS transistor T2 acts as a MOS transistor of a source follower type, and thus image data appears as a voltage signal on the signal line 5. Moreover, the output signal output through the MOS transistor T3 is proportional to the gate voltage of the MOS transistor T2, and is thus linearly proportional to the amount of light incident on the photodiode PD. As described previously, this image data is, when the switch Sa is turned on, fed by way of the signal line 5 and the switch Sa to the capacitor Ca. After the image data is stored in the capacitor Ca, the switch Sa is turned off.

After the image data proportional to the amount of incident light is output in this way, the MOS transistor T3 is turned off, and a high level is fed as the signal φVRS to the gate of the MOS transistor T4 to turn it on. This initializes the photodiode PD, the drain voltage of the MOS transistor T1, and the gate voltage of the MOS transistors T1 and T2. Then, the MOS transistor T3 is turned on again and the switch Sb is turned on so that the noise component occurring in each pixel is fed by way of the signal line 5 and the switch Sb to the capacitor Cb. After the noise component is output in this way, the switch Sb and the MOS transistor T3 are turned off.

2. First Example of the Configuration of the Compensation Pixels.

An example of the configuration of the compensation pixels used in cases where the ordinary pixels are configured as shown in FIG. 7 will be described below. In this example, the compensation pixels are configured, just like the ordinary pixels, as shown in FIG. 7. The compensation pixel configured as shown in FIG. 7 operates as follows.

(a) When the Pixel Outputs Image Data by Natural-Logarithmically Converting the Photocurrent When the ordinary pixel outputs, as image data, an output signal obtained through natural-logarithmic conversion, in the compensation pixel that outputs compensation data with which to compensate that image data, just as in the ordinary pixel, the signal φVPS is turned to a low level so that the MOS transistor TI is so biased as to operate in a subthreshold region. Then, as in the first embodiment, the signal φVRS is turned to a high level, and then a pulse is fed as the signal φV to the gate of the MOS transistor T3 so that the compensation data is output to the signal line 5. As described previously, this compensation data is, when the switch Sa is turned on, fed by way of the signal line 5 and the switch Sa to the capacitor Ca.

After the compensation data is stored in the capacitor Ca in this way, the MOS transistor T3 and the switch Sa are turned off and the switch Sb is turned on so that the noise component occurring in each pixel is fed by way of the signal line 5 and the switch Sb to the Capacitor Cb. At this time, the signal φVRS is at a low level.

(b) When the Pixel Outputs Image Data by Linearly Converting the Photocurrent

When the ordinary pixel outputs, as image data, an output signal obtained through linear conversion, in the compensation pixel that outputs compensation data with which to compensate that image data, just as in the ordinary pixel, the signal φVPS is turned to a high level so that the MOS transistor Ti is brought into a cut-off state. Then, as in the first embodiment, the signal φVRS is turned to a high level, and then a pulse is fed as the signal φV to the gate of the MOS transistor T3 so that the compensation data is output to the signal line 5. As described previously, this compensation data is, when the switch Sa is turned on, fed by way of the signal line 5 and the switch Sa to the capacitor Ca.

After the compensation data is stored in the capacitor Ca in this way, the MOS transistor T3 and the switch Sa are turned off and the switch Sb is turned on so that the noise component occurring in each pixel is fed by way of the signal line 5 and the switch Sb to the Capacitor Cb. At this time, the signal φVRS is at a low level.

In this way, the voltage of the signal φVPS is varied according to how the ordinary pixel is operating so that the output signal obtained from the compensation pixel when it is operating in the same mode as the ordinary pixel is output as compensation data. By configuring the compensation pixels in largely the same manner as the ordinary pixels in this way, it is possible to obtain compensation data that reflects the potential state of the photoelectric conversion circuits; that is, it is possible to obtain compensation data under largely the same conditions under which the ordinary pixels operate.

3. Second Example of the Configuration of the Compensation Pixels.

Another example of the configuration of the compensation pixels used in cases where the ordinary pixels are configured as shown in FIG. 7 will be described below. In the configuration shown in FIG. 8, such circuit components as serve the same purposes as in the pixel shown in FIG. 7 are identified with the same reference numerals, and their explanations will be omitted.

The pixel shown in FIG. 8 differs from the pixel shown in FIG. 7 in that the node between the drain and gate of the MOS transistor Ti is not connected to the node between the gate of the MOS transistor T2 and the drain of the MOS transistor T4. That is, the relationship between the compensation pixel of this example and the ordinary pixel of this embodiment is the same as the relationship between the compensation pixel of the second example (FIG. 5) of the first embodiment and the ordinary pixel (FIG. 3) of that embodiment.

In the compensation pixel configured as described above, just as in the compensation pixel (of the first example) configured as shown in FIG. 7, when the ordinary pixel outputs image data obtained through natural-logarithmic conversion, the signal φVPS is turned to a low level so that the MOS transistor Ti operates in a subthreshold region; by contrast, when the ordinary pixel outputs image data obtained through linear conversion, the signal φVPS is turned to a high level so that the MOS transistor Ti is brought into a cut-off state.

In this way, the voltage of the signal φVPS is varied according to how the ordinary pixel is operating so as to switch the state of the MOS transistor T1 so that, as in the first example, the output signal obtained from the compensation pixel when it is operating in the same mode as the ordinary pixel is output as compensation data. As described previously, this compensation data is, when the switch Sa is turned on, fed by way of the signal line 5 and the switch Sa to the capacitor Ca.

After the compensation data is stored in the capacitor Ca in this way, the MOS transistor T3 and the switch Sa are turned off and the switch Sb is turned on so that the noise component occurring in each pixel is fed by way of the signal line 5 and the switch Sb to the Capacitor Cb. At this time, the signal φVRS is at a low level.

By configuring the compensation pixels in largely the same manner as the ordinary pixels in this way, it is possible to obtain compensation data that reflects the potential state of the photoelectric conversion circuits; that is, it is possible to obtain compensation data under largely the same conditions under which the ordinary pixels operate. Moreover, by disconnecting the photoelectric conversion circuits from the output amplifier circuits, it is possible to prevent the compensation data output from the output amplifier circuits from being influenced by the signals output from the photoelectric conversion circuits; that is, it is possible to obtain compensation data with the output amplifier circuits fed with a constant direct-current voltage all the time.

4. Third Example of the Configuration of the Compensation Pixels.

In this example, the compensation pixels are configured, just like the compensation pixel of the third example of the first embodiment, as shown in FIG. 6. Thus, the compensation pixel of this example is configured and operates just as described previously in connection with the first embodiment, and therefore no description thereof will be given anew. Configured in this way, the compensation pixel of this example has a simpler configuration than that of the second example (FIG. 8) of this embodiment, thanks to the elimination of the photoelectric conversion circuit. This helps make the compensation pixels smaller in size than the ordinary pixels, and thereby minimize the extent to which the size of the compensation pixels limits the size of the ordinary pixels.

The image data obtained from the ordinary pixel configured as shown in FIG. 7 is cleared of its noise component by the differential amplifier circuit 12 (FIG. 1), and is then output as image data that still includes the influence of the MOS transistor Q1. On the other hand, the compensation data output from the compensation pixel configured like one of the first to third examples described above of this embodiment is cleared of its noise component by the differential amplifier circuit 12, and is then subtracted from the image data by the differential amplifier circuit 11 (FIG. 1). In this way, the image data is cleared of the variation component resulting from the influence of the MOS transistor Q1. This makes it possible to eliminate fixed pattern noise such as vertical stripes.

Third Embodiment

Figure 9:
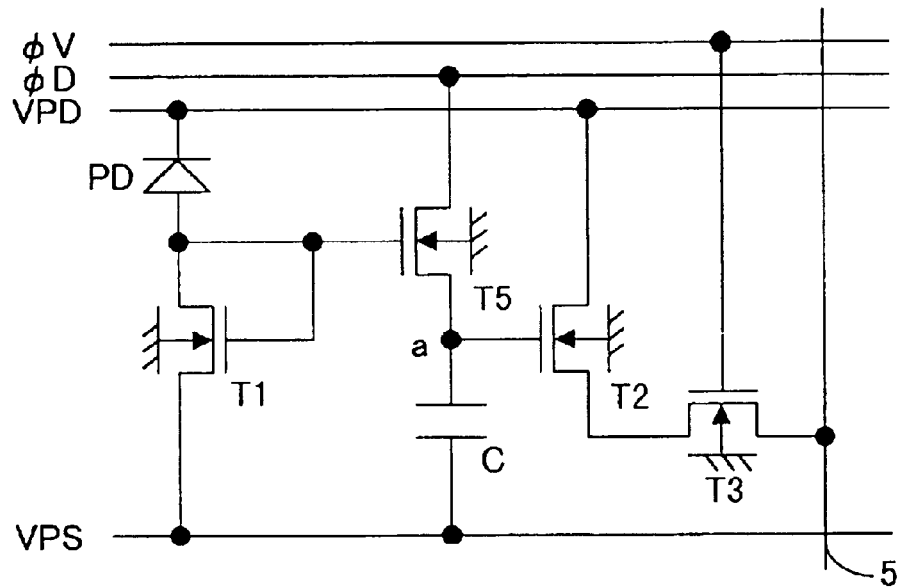
FIG. 9 is a circuit diagram showing another example of the configuration of an ordinary pixel.
Figure 10:
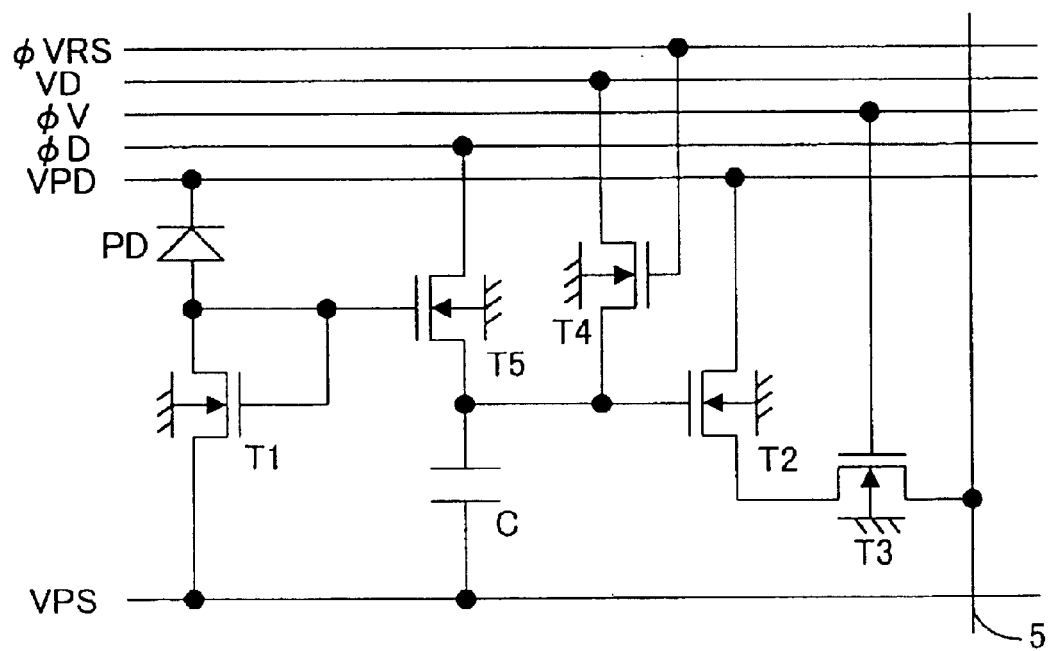
FIG. 10 is a circuit diagram showing another example of the configuration of a compensation pixel.
Figure 11:
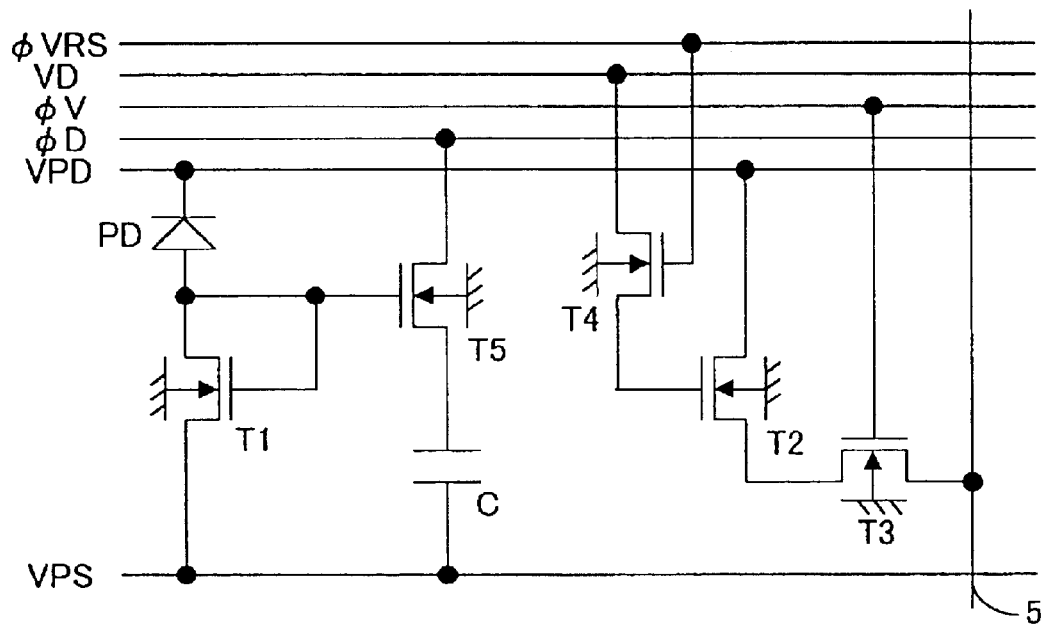
FIG. 11 is a circuit diagram showing another example of the configuration of a compensation pixel.

A third embodiment of the invention, which is applicable to the ordinary pixels provided in an area sensor configured as shown in FIG. 1, will be described below with reference to the drawings. FIG. 9 is a circuit diagram showing an example of the configuration of the ordinary pixels in this embodiment. FIGS. 10 and 11 are circuit diagrams showing examples of the configuration of the compensation pixels in this embodiment.

1. Configuration of the Ordinary Pixels

In the pixel shown in FIG. 9, such circuit elements, signal lines, and the like as serve the same purposes as in the pixel shown in FIG. 3 are identified with the same reference numerals, and their explanations will be omitted. The pixel shown in FIG. 9 is obtained by additionally providing, in the pixel shown in FIG. 3, a MOS transistor T5 having its gate connected to the node between the drain and gate of the MOS transistor T1 and having its source connected to the gate of the MOS transistor T2, and a capacitor C having one end connected to the node between the gate of the MOS transistor T2 and the source of the MOS transistor T5 and receiving the direct-current voltage VPS at the other end.

Moreover, a signal φD is fed to the drain of the MOS transistor T5. The MOS transistor T5 is, like the MOS transistors T1 to T3, an N-channel MOS transistor with its back gate grounded. Here, the MOS transistors T1 and T5, the photodiode PD, and the capacitor C together form a photoelectric conversion circuit, and the MOS transistors T2 and T3 together form an output amplifier circuit.

In this pixel configured as described above, when the signal φD is turned to a high level (for example, a voltage equal to the direct-current voltage VPD), image sensing is started. In this state, when light is incident on the photodiode PD, a photocurrent occurs therein, and, owing to the sub-threshold characteristics of a MOS transistor, a voltage natural-logarithmically proportional to the photocurrent appears at the gates of the MOS transistors T1 and T5. This voltage causes a current to flow through the MOS transistor T5, with the result that an amount of electric charge equivalent to the value obtained by natural-logarithmically converting the integral of the photocurrent is accumulated in the capacitor C. That is, a voltage natural-logarithmically proportional to the integral of the photocurrent appears at the node "a" between the capacitor C and the MOS transistor T5. At this time, the MOS transistor T3 is off.

Next, a pulse is fed as the signal φV to the gate of the MOS transistor T3 to turn it on. As a result, a current proportional to the voltage appearing at the gate of the MOS transistor T2 is delivered through the MOS transistors T2 and T3 to the output signal line 5. Here, since the voltage appearing at the gate of the MOS transistor T2 equals the voltage appearing at the node "a", the current delivered to the output signal line 5 is natural-logarithmically proportional to the integral of the photocurrent. In this way, image data is output, and, as described previously, this image data is, when the switch Sa is turned on, fed by way of the signal line 5 and the switch Sa to the capacitor Ca.

After the image data is output, the switch Sa and the MOS transistor T3 are turned off. Thereafter, the MOS transistor T3 is turned off and the signal φD is turned to a low level (for example, a voltage lower than the signal φVPS) so that the electric charge accumulated in the capacitor C is discharged through the MOS transistor T5 to the signal line of the signal φD. This initializes the capacitor C and the voltage at the node "a". Then, the MOS transistor T3 is turned on again and the switch Sb is turned on so that the noise component occurring in each pixel is fed by way of the signal line 5 and the switch Sb to the capacitor Cb. After the noise component is output in this way, the switch Sb and the MOS transistor T3 are turned off.

In this configuration, the output signal of the pixel is first turned into a signal integrated by the capacitor C. This permits a variation component associated with the light source and high-frequency noise to be absorbed by the capacitor C and thereby eliminated from the output signal.

2. First Example of the Configuration of the Compensation Pixels.

An example of the configuration of the compensation pixels used in cases where the ordinary pixels are configured as shown in FIG. 9 will be described below with reference to FIG. 10. In the configuration shown in FIG. 10, such circuit components as serve the same purposes as in the pixel shown in FIG. 9 are identified with the same reference numerals, and their explanations will be omitted.

The pixel shown in FIG. 10 is obtained by additionally providing, in the pixel shown in FIG. 9, a MOS transistor T4 having its drain connected to the node between the gate of the MOS transistor T2 and the source of the MOS transistor T5. This MOS transistor T4 receives the direct-current voltage VD at its source, and receives the signal φVRS at its gate. The MOS transistor T4 is, like the MOS transistors T1 to T3, an N-channel MOS transistor with its back gate grounded. That is, the relationship between the compensation pixel of this example and the ordinary pixel of this embodiment is the same as the relationship between the compensation pixel of the first example (FIG. 4) of the first embodiment and the ordinary pixel (FIG. 3) of that embodiment.

In this pixel configured as described above, as in the first embodiment, first, the signal φVRS is turned to a high level to turn on the MOS transistor T4 so that the direct-current voltage VD is fed to the gate of the MOS transistor T2. Then, a pulse is fed as the signal φV to the MOS transistor T3. As a result, the MOS transistor T2 outputs, as an output current, its source current, which is commensurate with the direct-current voltage VD fed to its gate, through the MOS transistor T3 to the signal line 5.

Here, the MOS transistor T2 acts as a MOS transistor of a source follower type, and thus compensation data appears as a voltage signal on the signal line 5. Moreover, the output signal output through the MOS transistor T3 is proportional to the gate voltage of the MOS transistor T2, and is thus commensurate with the direct-current voltage VD. As described previously, this compensation data is, when the switch Sa is turned on, fed by way of the signal line 5 and the switch Sa to the capacitor Ca.

After the compensation data is stored in the capacitor Ca in this way, the MOS transistor T3 and the switch Sa are turned off and the switch Sb is turned on so that the noise component occurring in each pixel is fed by way of the signal line 5 and the switch Sb to the capacitor Cb. At this time, the signal φVRS is at a low level.

The compensation data thus output is used as signals representing variations in characteristics among the MOS transistors Q1 (FIG. 1) connected to the signal lines 5-1 to 5-m (FIG. 1). By configuring the compensation pixels in largely the same manner as the ordinary pixels, it is possible to obtain compensation data that reflects the potential state of the photoelectric conversion circuits; that is, it is possible to obtain compensation data under largely the same conditions under which the ordinary pixels operate.

3. Second Example of the Configuration of the Compensation Pixels.

Another example of the configuration of the compensation pixels used in cases where the ordinary pixels are configured as shown in FIG. 9 will be described below with reference to FIG. 11. In the configuration shown FIG. 11, such circuit components as serve the same purposes as in the pixel shown in FIG. 10 are identified with the same reference numerals, and their explanations will be omitted.

The pixel shown in FIG. 11 differs from the pixel shown in FIG. 10 in that the node between the source of the MOS transistor T5 and the capacitor C is not connected to the node between the gate of the MOS transistor T2 and the drain of the MOS transistor T4. Thus, the voltage that appears at the node between the source of the MOS transistor T5 and the capacitor C, which constitute the photoelectric conversion circuit, is not fed to the gate of the MOS transistor T2, which constitutes the output amplifier circuit. That is, the relationship between the compensation pixel of this example and the ordinary pixel of this embodiment is the same as the relationship between the compensation pixel of the second example (FIG. 5) of the first embodiment and the ordinary pixel (FIG. 3) of that embodiment.

In this pixel configured as described above, as in the pixel shown in FIG. 10, first, the signal φVRS is turned to a high level to turn on the MOS transistor T4 so that the direct-current voltage VD is fed to the gate of the MOS transistor T2. Then, a pulse is fed as the signal φV to the MOS transistor T3. As a result, the MOS transistor T2 outputs, as an output current, its source current, which is commensurate with the direct-current voltage VD fed to its gate, through the MOS transistor T3 to the signal line 5.

Here, the MOS transistor T2 acts as a MOS transistor of a source follower type, and thus compensation data appears as a voltage signal on the signal line 5. Moreover, the output signal output through the MOS transistor T3 is proportional to the gate voltage of the MOS transistor T2, and is thus commensurate with the direct-current voltage VI). As described previously, this compensation data is, when the switch Sa is turned on, fed by way of the signal line 5 and the switch Sa to the capacitor Ca.

After the compensation data is stored in the capacitor Ca in this way, the MOS transistor T3 and the switch Sa are turned off and the switch Sb is turned on so that the noise component occurring in each pixel is fed by way of the signal line 5 and the switch Sb to the capacitor Cb. At this time, the signal φVRS is at a low level.

The compensation data thus output is used as signals representing variations in characteristics among the MOS transistors Q1 (FIG. 1) connected to the signal lines 5-1 to 5-m (FIG. 1). By configuring the compensation pixels so as to include photoelectric conversion circuits in this way, it is possible to obtain compensation data that reflects the potential state of the photoelectric conversion circuits; that is, it is possible to obtain compensation data under largely the same conditions under which the ordinary pixels operate. Moreover, by disconnecting the photoelectric conversion circuits from the output amplifier circuits, it is possible to prevent the compensation data output from the output amplifier circuits from being influenced by the signals output from the photoelectric conversion circuits; that is, it is possible to obtain compensation data with the output amplifier circuits fed with a constant direct-current voltage all the time.

4. Third Example of the Configuration of the Compensation Pixels.

In this example, the compensation pixels are configured, just like the compensation pixel of the second example of the first embodiment, as shown in FIG. 5. Thus, the compensation pixel of this example is configured and operates just as described previously in connection with the first embodiment, and therefore no description thereof will be given anew. Configured in this way, the compensation pixel of this example has a simpler configuration than that of the second example (FIG. 11) of this embodiment, thanks to the elimination of the MOS transistor T5 and the capacitor C. This helps make the compensation pixels smaller in size than the ordinary pixels, and thereby minimize the extent to which the size of the compensation pixels limits the size of the ordinary pixels.

5. Fourth Example of the Configuration of the Compensation Pixels.

In this example, the compensation pixels are configured, just like the compensation pixel of the third example of the first embodiment, as shown in FIG. 6. Thus, the compensation pixel of this example is configured and operates just as described previously in connection with the first embodiment, and therefore no description thereof will be given anew. Configured in this way, the compensation pixel of this example has an even simpler configuration than that of the third example (FIG. 5) of this embodiment, thanks to the elimination of the photoelectric conversion circuit. This helps make the compensation pixels smaller in size than the ordinary pixels, and thereby minimizes the extent to which the size of the compensation pixels limits the size of the ordinary pixels.

The image data obtained from the ordinary pixel configured as shown in FIG. 9 is cleared of its noise component by the differential amplifier circuit 12 (FIG. 1), and is then output as image data that still includes the influence of the MOS transistor Q1. On the other hand, the compensation data output from the compensation pixel configured like one of the first to fourth examples described above of this embodiment is cleared of its noise component by the differential amplifier circuit 12, and is then subtracted from the image data by the differential amplifier circuit 11 (FIG. 1). In this way, the image data is cleared of the variation component resulting from the influence of the MOS transistor Q1. This makes it possible to eliminate fixed pattern noise such as vertical stripes.

Fourth Embodiment

Figure 12:
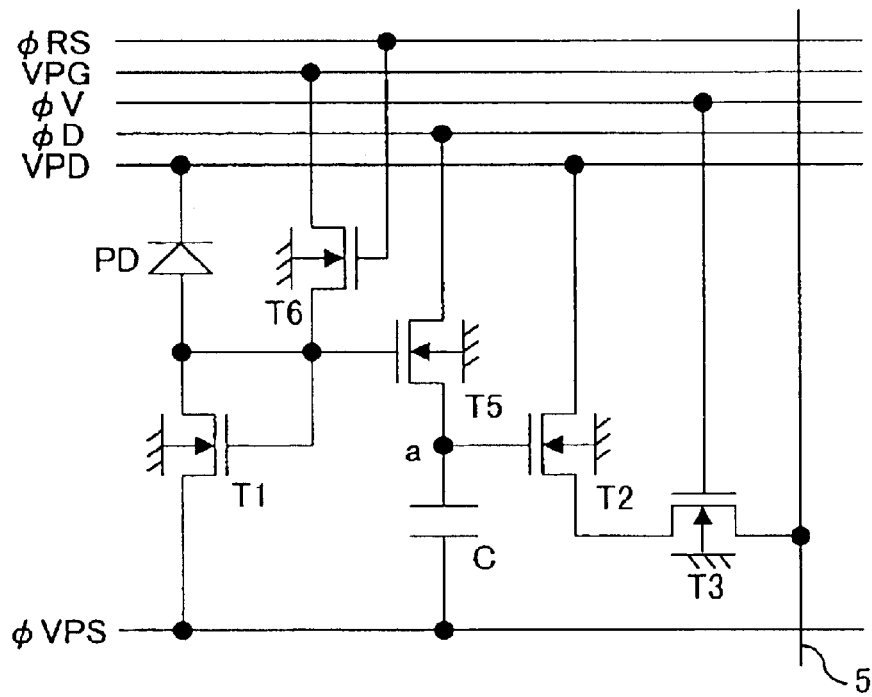
FIG. 12 is a circuit diagram showing another example of the configuration of an ordinary pixel.
Figure 13:
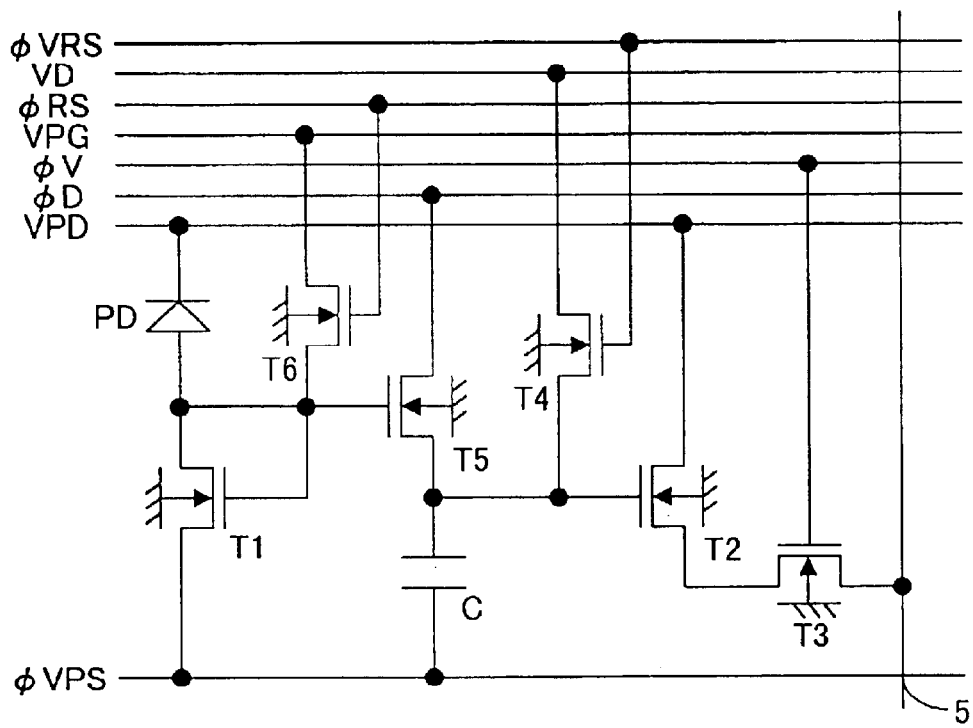
FIG. 13 is a circuit diagram showing another example of the configuration of a compensation pixel.
Figure 14:
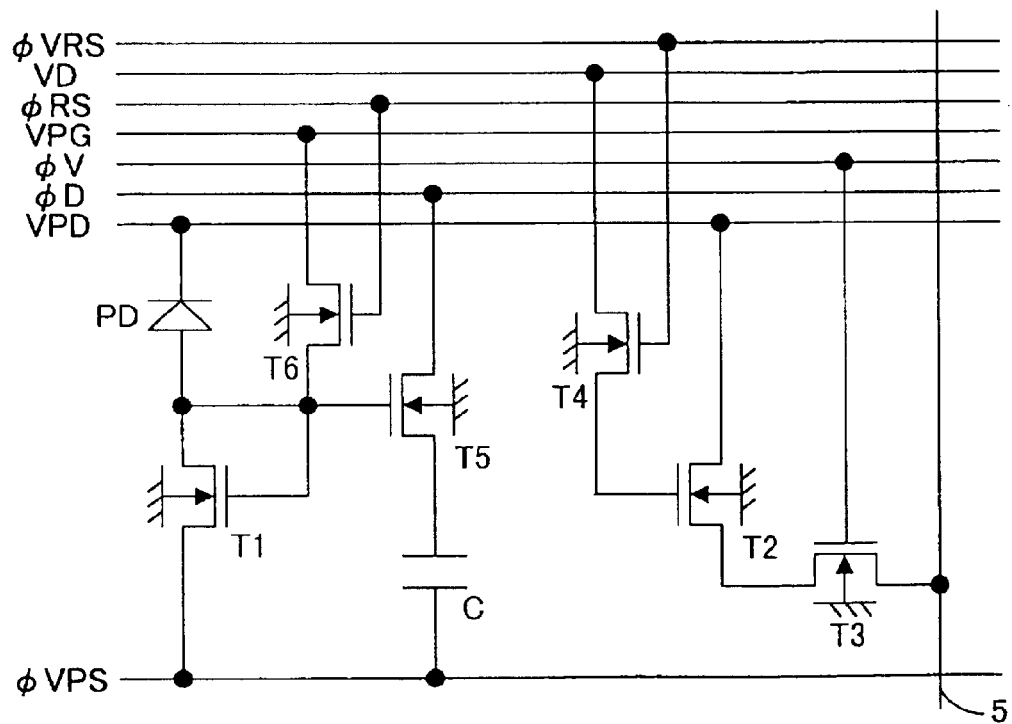
FIG. 14 is a circuit diagram showing another example of the configuration of a compensation pixel.
Figure 15:
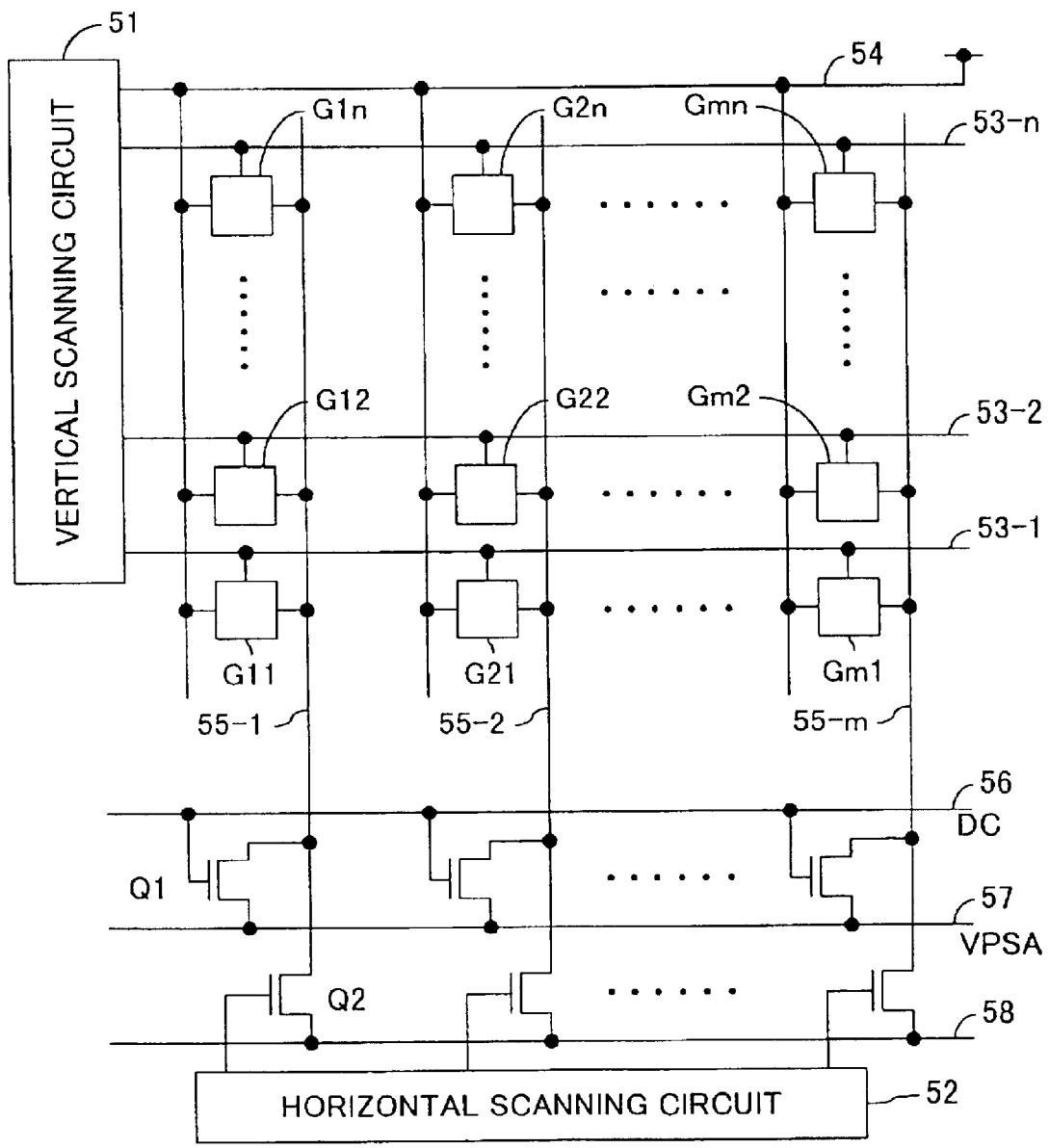
FIG. 15 is a block diagram showing the internal configuration of a conventional area sensor.

A fourth embodiment of the invention, which is applicable to the ordinary pixels provided in an area sensor configured as shown in FIG. 1, will be described below with reference to the drawings. FIG. 12 is a circuit diagram showing an example of the configuration of the ordinary pixels in this embodiment. FIGS. 13 and 14 are circuit diagrams showing examples of the configuration of the compensation pixels in this embodiment.

1. Configuration of the Ordinary Pixels

In the pixel shown in FIG. 12, such circuit elements, signal lines, and the like as serve the same purposes as in the pixel shown in FIG. 9 are identified with the same reference numerals, and their explanations will be omitted. The pixel shown in FIG. 12 is obtained by additionally providing, in the pixel shown in FIG. 9, a MOS transistor T6 having its drain connected to the node at which the drain and gate of the MOS transistor T1 and the gate of the MOS transistor T5 are connected together.

A signal φVPS is fed to the source of the MOS transistor Ti and to one end of the capacitor C. A direct-current voltage VPG is applied to the source of the MOS transistor T6, and a signal φRS is fed to the gate thereof. The MOS transistor T6 is, like the MOS transistors T1 to T3 and T5, an N-channel MOS transistor with its back gate grounded. Here, the MOS transistors T1, T5, and T6, the photodiode PD, and the capacitor C together constitute a photoelectric conversion circuit, and the MOS transistors T2 and T3 together constitute an output amplifier circuit.

As in the second embodiment, the signal φVPS is a binary signal that takes one of two levels at a time, namely either a low level that permits the MOS transistors T1 and T5 to operate in a subthreshold region or a high level that approximately equals the direct-current voltage VPD. Thus, with this ordinary pixel configured as described above, as in the second embodiment, by varying the voltage of the signal φVPS, it is possible to make it output image data obtained by either natural-logarithmically or linearly converting the photocurrent that has occurred in the photodiode PD.

In this embodiment, when the output current is produced by natural-logarithmically converting the photocurrent, the signal φRS is kept at a low level all the time to keep the MOS transistor T6 off Moreover, the signal φVPS is turned to a low level, and he signal φD is turned to a high level (for example, a voltage approximately equal to the direct-current voltage VPD). As a result, an amount of electric charge equivalent to the value obtained by natural-logarithmically converting the integral of the photocurrent is accumulated in the capacitor C. Then, with predetermined timing, the MOS transistor T3 is turned on so that a current proportional to the voltage appearing at the gate of the MOS transistor T2 is delivered through the MOS transistors T2 and T3 to the output signal line 5 to achieve output of image data. In this way, the image data is output, and, as described previously, this image data is, when the switch Sa is turned on, fed by way of the signal line 5 and the switch Sa to the capacitor Ca.

Thereafter, the switch Sa and the MOS transistor T3 are turned off and the signal φD is turned to a low level (for example, a voltage lower than the signal φVPS) so that the electric charge accumulated in the capacitor C is discharged through the MOS transistor T5 to the signal line of the signal φD. This initializes the capacitor C and the voltage at the node "a". Then, the MOS transistor T3 is turned on again and the switch Sb is turned on so that the noise component occurring in each pixel is fed by way of the signal line 5 and the switch Sb to the capacitor Cb. After the noise component is output in this way, the MOS transistor T3 is turned off.

By contrast, when the output current is produced by linearly converting the photocurrent, first, the signal φRS is turned to a low level to turn off the MOS transistor T6. Moreover, the signal φVPS is turned to a high level, and the signal φD is turned to a high level. Prior to these actions, the voltage at the node "a", has been made lower than the direct-current voltage VPD, as in the third embodiment, through initialization performed using the MOS transistor T5. In this state, an amount of electric charge equivalent to the value obtained by linearly converting the integral of the photocurrent is accumulated in the capacitor C.

Then, with predetermined timing, the MOS transistor T3 is turned on so that a current proportional to the voltage appearing at the gate of the MOS transistor T2 is delivered through the MOS transistors T2 and T3 to the output signal line 5 to achieve output of image data. In this way, the image data is output, and, as described previously, this image data is, when the switch Sa is turned on, fed by way of the signal line 5 and the switch Sa to the capacitor Ca.

Thereafter, the switch Sa and the MOS transistor T3 are turned off and the signal φD is turned to a low level so that the electric charge accumulated in the capacitor C is discharged through the MOS transistor T5 to the signal line of the signal φD. This initializes the voltage at the node "a", for example, to a voltage lower than the signal φVPS. Subsequently, the MOS transistor T6 is turned on. This initializes the photodiode PD, the drain voltage of the MOS transistor T1, and the gate voltage of the MOS transistors T1 and T5. Then, the MOS transistor T3 is turned on again and the switch Sb is turned on so that the noise component occurring in each pixel is fed by way of the signal line 5 and the switch Sb to the capacitor Cb. After the noise component is output in this way, the switch Sb and the MOS transistor T3 are turned off.

2. First Example of the Configuration of the Compensation Pixels.

An example of the configuration of the compensation pixels used in cases where the ordinary pixels are configured as shown in FIG. 12 will be described below. In the configuration shown in FIG. 13, such circuit components as serve the same purposes as in the pixel shown in FIG. 12 are identified with the same reference numerals, and their explanations will be omitted.

The pixel shown in FIG. 13 is obtained by additionally providing, in the pixel shown in FIG. 12, a MOS transistor T4 having its drain connected to the node between the gate of the MOS transistor T2 and the source of the MOS transistor T5. This MOS transistor T4 receives a direct-current voltage VD at its source, and receives a signal φVRS at its gate. The MOS transistor T4 is, like the MOS transistors T1 to T3, an N-channel MOS transistor with its back gate grounded. That is, the relationship between the compensation pixel of this example and the ordinary pixel of this embodiment is the same as the relationship between the compensation pixel of the first example (FIG. 4) of the first embodiment and the ordinary pixel (FIG. 3) of that embodiment.

In this pixel configured as described above, as in the second embodiment, when the ordinary pixel outputs, as image data, an output signal obtained through natural-logarithmic conversion, the signal φVPS is turned to a low level and, when the ordinary pixel outputs, as image data, an output signal obtained through linear conversion, the signal φVPS is turned to a high level. After the signal φVPS is brought into the same state as in the ordinary pixel that outputs the image data in this way, first, the signal φVRS is turned to a high level to turn on the MOS transistor T4 so that the direct-current voltage VD is fed to the gate of the MOS transistor T2. Then, a pulse is fed as the signal φV to the MOS transistor T3. As a result, the MOS transistor T2 outputs, as an output current, its source current, which is commensurate with the direct-current voltage VD fed to its gate, through the MOS transistor T3 to the signal line 5.

Here, the MOS transistor T2 acts as a MOS transistor of a source follower type, and thus compensation data appears as a voltage signal on the signal line 5. Moreover, the output signal output through the MOS transistor T3 is proportional to the gate voltage of the MOS transistor T2, and is thus a signal that is commensurate with the direct-current voltage VD. As described previously, this compensation data is, when the switch Sa is turned on, fed by way of the signal line 5 and the switch Sa to the capacitor Ca.

After the compensation data is stored in the capacitor Ca in this way, the MOS transistor T3 and the switch Sa are turned off and the switch Sb is turned on so that the noise component occurring in each pixel is fed by way of the signal line 5 and the switch Sb to the capacitor Cb. At this time, the signal φVRS is at a low level.

The compensation data thus output is used as signals representing variations in characteristics among the MOS transistors Q1 (FIG. 1) connected to the signal lines 5-1 to 5-m (FIG. 1). By configuring the compensation pixels in largely the same manner as the ordinary pixels in this way, it is possible to obtain compensation data that reflects the potential state of the photoelectric conversion circuits; that is, it is possible to obtain compensation data under largely the same conditions under which the ordinary pixels operate.

3. Second Example of the Configuration of the Compensation Pixels.

Another example of the configuration of the compensation pixels used in cases where the ordinary pixels are configured as shown in FIG. 12 will be described below. In the configuration shown in FIG. 14, such circuit components as serve the same purposes as in the pixel shown in FIG. 13 are identified with the same reference numerals, and their explanations will be omitted.

The pixel shown in FIG. 14 differs from the pixel shown in FIG. 13 in that the node between the source of the MOS transistor T5 and the capacitor C is not connected to the node between the gate of the MOS transistor T2 and the drain of the MOS transistor T4. Thus, the voltage that appears at the node between the source of the MOS transistor T5 and the capacitor C, which constitute the photoelectric conversion circuit, is not fed to the gate of the MOS transistor T2, which constitutes the output amplifier circuit. That is, the relationship between the compensation pixel of this example and the ordinary pixel of this embodiment is the same as the relationship between the compensation pixel of the second example (FIG. 5) of the first embodiment and the ordinary pixel (FIG. 3) of that embodiment.

In this pixel configured as described above, as in the second embodiment, when the ordinary pixel outputs, as image data, an output signal obtained through natural-logarithmic conversion, the signal φVPS is turned to a low level and, when the ordinary pixel outputs, as image data, an output signal obtained through linear conversion, the signal φVPS is turned to a high level. After the signal φVPS is brought into the same state as in the ordinary pixel that outputs the image data in this way, first, the signal φVRS is turned to a high level to turn on the MOS transistor T4 so that the direct-current voltage VD is fed to the gate of the MOS transistor T2. Then, a pulse is fed as the signal φV to the MOS transistor T3. As a result, the MOS transistor T2 outputs, as an output current, its source current, which is commensurate with the direct-current voltage VD fed to its gate, through the MOS transistor T3 to the signal line 5.

Here, the MOS transistor T2 acts as a MOS transistor of a source follower type, and thus compensation data appears as a voltage signal on the signal line 5. Moreover, the output signal output through the MOS transistor T3 is proportional to the gate voltage of the MOS transistor T2, and is thus a signal that is commensurate with the direct-current voltage VD. As described previously, this compensation data is, when the switch Sa is turned on, fed by way of the signal line 5 and the switch Sa to the capacitor Ca.

After the compensation data is stored in the capacitor Ca in this way, the MOS transistor T3 and the switch Sa are turned off and the switch Sb is turned on so that the noise component occurring in each pixel is fed by way of the signal line 5 and the switch Sb to the capacitor Cb. At this time, the signal φVRS is at a low level.

The compensation data thus output is used as signals representing variations in characteristics among the MOS transistors Q1 (FIG. 1) connected to the signal lines 5-1 to 5-m (FIG. 1). By configuring the compensation pixels so as to include photoelectric conversion circuits in this way, it is possible to obtain compensation data that reflects the potential state of the photoelectric conversion circuits; that is, it is possible to obtain compensation data under largely the same conditions under which the ordinary pixels operate. Moreover, by disconnecting the photoelectric conversion circuits from the output amplifier circuits, it is possible to prevent the compensation data output from the output amplifier circuits from being influenced by the signals output from the photoelectric conversion circuits; that is, it is possible to obtain compensation data with the output amplifier circuits fed with a constant direct-current voltage all the time.

4. Third Example of the Configuration of the Compensation Pixels.

In this example, the compensation pixels are configured, just like the compensation pixel of the second example of the second embodiment, as shown in FIG. 8. Thus, the compensation pixel of this example is configured and operates just as described previously in connection with the second embodiment, and therefore no description thereof will be given anew. Configured in this way, the compensation pixel of this example has a simpler configuration than that of the second example (FIG. 14) of this embodiment, thanks to the elimination of the MOS transistors T5 and T6 and the capacitor C. This helps make the compensation pixels smaller in size than the ordinary pixels, and thereby minimize the extent to which the size of the compensation pixels limits the size of the ordinary pixels.

5. Fourth Example of the Configuration of the Compensation Pixels.

In this example, the compensation pixels are configured, just like the compensation pixel of the third example of the first embodiment, as shown in FIG. 6. Thus, the compensation pixel of this example is configured and operates just as described previously in connection with the first embodiment, and therefore no description thereof will be given anew. Configured in this way, the compensation pixel of this example has an even simpler configuration than that of the third example (FIG. 8) of this embodiment, thanks to the elimination of the photoelectric conversion circuit. This helps make the compensation pixels smaller in size than the ordinary pixels, and thereby minimizes the extent to which the size of the compensation pixels limits the size of the ordinary pixels.

The image data obtained from the ordinary pixel configured as shown in FIG. 12 is cleared of its noise component by the differential amplifier circuit 12 (FIG. 1), and is then output as image data that still includes the influence of the MOS transistor Q1. On the other hand, the compensation data output from the compensation pixel configured like one of the first to fourth examples described above of this embodiment is cleared of its noise component by the differential amplifier circuit 12, and is then subtracted from the image data by the differential amplifier circuit 11 (FIG. 1). In this way, the image data is cleared of the variation component resulting from the influence of the MOS transistor Q1. This makes it possible to eliminate fixed pattern noise such as vertical stripes.

The ordinary pixels may be configured in any other manner than specifically described above as the first to fourth embodiments (FIGS. 3, 7, 9, and 12); for example, they may be configured so as to include a photoelectric conversion circuit with its constituent circuit elements interconnected differently than in the embodiments described above, or may be composed of P-channel MOS transistors so as to operate with the opposite polarities.

In cases where the ordinary pixels have a modified configuration as described above, the compensation pixels may be, as in the first example of the first to fourth embodiments, so configured as to include a MOS transistor T4 having its source connected to the node between the photoelectric conversion circuit and the output amplifier circuit. Alternatively, the compensation pixels may be, as in the second example of the first to fourth embodiments, so configured that the MOS transistor T4 is provided on the input side of the output amplifier circuit and the photoelectric conversion circuit is disconnected from the output amplifier circuit.

Alternatively, the compensation pixels may be, as in the third example of the third and fourth embodiments, so configured that the photoelectric conversion circuit is composed solely of a photoelectric conversion element such as a photodiode and a circuit formed around it, that the MOS transistor T4 is provided on the input side of the output amplifier circuit, and that the photoelectric conversion circuit is disconnected from the output amplifier circuit. Alternatively, the compensation pixels may be, as in the third example of the first and second embodiments and the fourth example of the third and fourth embodiments, composed solely of the output amplifier circuit and the MOS transistor T4 provided on the input side thereof In the embodiments described above, as shown in FIG. 1, the area sensor has compensation pixels arranged in a single row. However, it is also possible to arrange such compensation pixels in a plurality of rows so that compensation data is generated on the basis of the outputs obtained from a plurality of compensation pixels for each column. For example, the area sensor may be so configured as to generate compensation data by calculating averages of the outputs obtained from a plurality of compensation pixels. In cases where compensation pixels are arranged in a plurality of rows, it is also possible to use, instead of the line memory used in the embodiments, an area memory to store the outputs obtained from the compensation pixels arranged in a plurality of rows.

As described above, according to the present invention, compensation pixels are arranged at least one for each column of pixels, and the output signals obtained from ordinary pixels and output by way of output signal lines provided one for each column of pixels are compensated with the compensation signals output from the compensation pixels. This makes it possible to eliminate vertical stripes resulting from the fact that, conventionally, output signal lines are provided one for each column of pixels.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A solid-state image-sensing device comprising:
   a first pixel including a photoelectric conversion element and capable of generating an output signal that is logarithmically proportional to an amount of light incident on the photoelectric conversion element;
   a second pixel for generating as an output signal a compensation signal with which to compensate the output signal of the first pixel; and
   a reading circuit for reading out the output signals of the first and second pixels.

2. A solid-state image-sensing device as claimed in claim 1,
   wherein the solid-state image-sensing device has a plurality of first pixels.

3. A solid-state image-sensing device as claimed in claim 2,
   wherein the solid-state image-sensing device has a plurality of second pixels.

4. A solid-state image-sensing device as claimed in claim 3,
   wherein the first pixels are arranged in a two-dimensional array, and the second pixels are arranged in a line in such a way as to correspond one to one to columns of the first pixels.

5. A solid-state image-sensing device as claimed in claim 4, further comprising:
   a plurality of output signal lines provided one for each column of pixels, the output signal lines each permitting the output signals of the first and second pixels arranged in an identical column to be extracted therethrough.

6. A solid-state image-sensing device as claimed in claim 1,
   wherein the second pixel is smaller in size than the first pixel.

7. A solid-state image-sensing device as claimed in claim 1,
   wherein the first and second pixels have different circuit configurations.

8. A solid-state image-sensing device as claimed in claim 7,
   wherein, whereas the first pixel includes the photoelectric conversion element, the second pixel includes no photoelectric conversion element.

9. A solid-state image-sensing device as claimed in claim 1,
   wherein the first and second pixels have an identical circuit configuration.

10. A solid-state image-sensing device as claimed in claim 9,
    wherein the first and second pixels receive different voltages.

11. A solid-state image-sensing device as claimed in claim 1,
    wherein the first and second pixels each include a plurality of MOS transistors.

12. A solid-state image-sensing device as claimed in claim 1,
    wherein the first pixel generates selectively either the output signal that is logarithmically proportional to the amount of incident light or an output signal that is linearly proportional to the amount of incident light.

13. A solid-state image-sensing device as claimed in claim 1, further comprising:
    a compensation circuit for compensating the output signal of the first pixel with the output signal of the second pixel.

14. A solid-state image-sensing device as claimed in claim 13,
    wherein the compensation circuit includes a storage circuit for storing the output signal of the second pixel and a differential amplifier circuit for outputting a difference between the output signal of the first pixel and the output signal of the second pixel stored in the storage circuit.

15. A solid-state image-sensing device comprising:
    a first pixel including a photoelectric conversion element and capable of generating selectively either an output signal that is logarithmically proportional to an amount of light incident on the photoelectric conversion element or an output signal that is linearly proportional to the amount of light incident on the photoelectric conversion element;
    a second pixel for generating as an output signal a compensation signal with which to compensate the output signal of the first pixel; and
    a reading circuit for reading out the output signals of the first and second pixels.

16. A solid-state image-sensing device comprising:
    a first pixel, which includes a photoelectric conversion element, for generating a first pixel output signal that is logarithmically proportional to an amount of light incident on the photoelectric conversion element;
    a second pixel for generating a second pixel output signal, wherein the second pixel output signal is used for reducing signal noise that is caused by the first pixel; and
    a reading circuit for reading out the output signals of the first and second pixels.

17. A solid-state image-sensing device as claimed in claim 16, further comprising a memory for storing the second pixel output signal.

18. A solid-state image-sensing device as claimed in claim 16, wherein the signal noise caused by the first pixel is a result of a switching action of at least one semiconductor device included therein.

19. A solid-state image-sensing device as claimed in claim 18, wherein the signal noise caused by the first pixel is a result of a transistor being turned off.

20. A solid-state image-sensing device as claimed in claim 16, wherein the signal noise caused by the first pixel is a result of the first pixel being reset.

21. A solid-state image sensing device comprising:

a first pixel including a photoelectric conversion element and capable of generating an output signal that is logarithmically proportional to an amount of light incident on the photoelectric conversion element;

a reading circuit for reading out the output signal of the first pixel; and a second pixel for generating a compensation signal with which to compensate for a variation ascribable to a characteristic of the reading circuit.

22. A solid-state image-sensing device as claimed in claim 21, wherein the characteristic of the reading circuit is an amplification factor thereof.

23. A solid-state image-sensing device as claimed in claim 21, wherein the reading circuit is a transistor.

* * * * *